United States Patent
Wang

(10) Patent No.: US 11,869,610 B2
(45) Date of Patent: Jan. 9, 2024

(54) STORAGE DEVICE

(71) Applicant: CHANGXIN MEMORY TECHNOLOGIES, INC., Hefei (CN)

(72) Inventor: Jia Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 105 days.

(21) Appl. No.: 17/664,035

(22) Filed: May 18, 2022

(65) Prior Publication Data

US 2022/0383971 A1 Dec. 1, 2022

(30) Foreign Application Priority Data

Jun. 1, 2021 (CN) .......................... 202110609025.1

(51) Int. Cl.
*G11C 29/02* (2006.01)
*G11C 7/06* (2006.01)

(52) U.S. Cl.
CPC ............ *G11C 29/026* (2013.01); *G11C 7/065* (2013.01)

(58) Field of Classification Search
CPC ....... G11C 29/026; G11C 7/065; G11C 29/42; G11C 29/44
USPC .......................................................... 365/200
See application file for complete search history.

(56) References Cited

U.S. PATENT DOCUMENTS

| | | | |
|---|---|---|---|
| 2021/0407611 A1* | 12/2021 | Liang | G11C 7/222 |
| 2022/0093164 A1 | 3/2022 | Chi et al. | |
| 2022/0093201 A1 | 3/2022 | Shang et al. | |
| 2022/0188151 A1* | 6/2022 | Muthiah | G06F 9/4881 |

FOREIGN PATENT DOCUMENTS

| | | |
|---|---|---|
| CN | 1404065 A | 3/2003 |
| CN | 113470711 A | 10/2021 |
| CN | 114203228 A | 3/2022 |
| CN | 114203230 A | 3/2022 |
| CN | 114203247 A | 3/2022 |
| WO | 2022057417 A1 | 3/2022 |
| WO | 2022057438 A1 | 3/2022 |
| WO | 2022057539 A1 | 3/2022 |

* cited by examiner

*Primary Examiner* — Anthan Tran
(74) *Attorney, Agent, or Firm* — Syncoda LLC; Feng Ma

(57) ABSTRACT

A storage device includes a storage circuit, a reading circuit, a first check circuit, and a second check circuit. The storage circuit includes a plurality of sense amplifier arrays and a plurality of storage unit arrays which are arranged alternately. A first data wire is electrically connected to each of the sense amplifier arrays. The reading circuit is configured to read data on the first data wire. Both the first check circuit and the second check circuit are electrically connected to the reading circuit. The reading circuit is configured to transmit a part of the read data to the first check circuit for error checking and/or correcting, and transmit another part of the read data to the second check circuit for error checking and/or correcting. The data transmitted to the first check circuit and the data transmitted to the second check circuit are respectively from adjacent sense amplifier arrays.

16 Claims, 12 Drawing Sheets

STORAGE DEVICE

CROSS-REFERENCE TO RELATED APPLICATION

This application claims priority to Chinese Patent Application No. 202110609025.1 filed on Jun. 1, 2021, the disclosure of which is hereby incorporated by reference in its entirety.

BACKGROUND

With rapid development of semiconductor technologies, requirements for the storage capacity of semiconductor storage devices and their read and write efficiency of stored data become higher and higher in the market. In addition, with the increase of user demand and cost requirements on the application side, the volume of storage array units of semiconductor storage devices needs to be continuously reduced, which brings higher challenges to the process manufacturing. In turn, the probability of a failure defect of a single storage unit and a failure defect between adjacent storage units is also increasing.

SUMMARY

The disclosure relates to the technical field of semiconductor storage, and in particular a storage device.

The disclosure provides a storage device, including a storage circuit, a reading circuit, a first check circuit, and a second check circuit. The storage circuit includes a plurality of sense amplifier arrays and a plurality of storage unit arrays, the sense amplifier arrays and the storage unit arrays are arranged alternately, and the sense amplifier arrays are configured to read and write data to the storage unit arrays. A first data wire is electrically connected to each of the sense amplifier arrays. The reading circuit is electrically connected to the first data wire and configured to read data on the first data wire. The first check circuit is electrically connected to the reading circuit. The second check circuit is electrically connected to the reading circuit. The reading circuit is configured to transmit a part of read data to the first check circuit for error checking and/or correcting, and transmit another part of the read data to the second check circuit for error checking and/or correcting, where the data transmitted to the first check circuit and the data transmitted to the second check circuit are respectively from adjacent sense amplifier arrays.

BRIEF DESCRIPTION OF THE DRAWINGS

In order to more clearly describe the technical solution in the embodiments of the disclosure, the following is a brief introduction of the accompanying drawings required in the description of the embodiments. Apparently, the accompanying drawings in the following description are only some embodiments of the disclosure. A person of ordinary skill in the art may further obtain other drawings according to these accompanying drawings without creative efforts.

DETAILED DESCRIPTION

Figure 1:
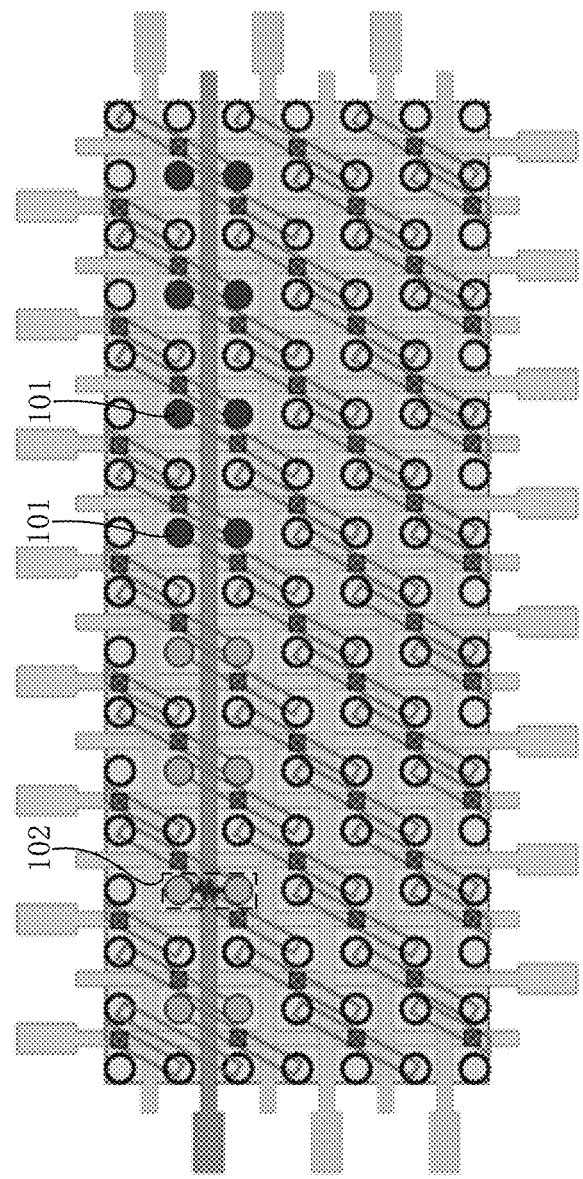
FIG. 1 is a schematic structural diagram of a storage device having a failure defect of a storage unit.

For ease of understanding the disclosure, a more complete description of the disclosure will be given below with reference to the accompanying drawings. The accompanying drawings show the illustrative embodiments of the disclosure. However, the disclosure may be implemented in many different forms and is not limited to the embodiments described herein. On the contrary, an objective of providing these embodiments is to make the disclosure more thorough.

Unless otherwise defined, all technical and scientific terms used herein have the same meaning as those normally understood by persons of ordinary skill in the art of the disclosure. The terms used herein in the specification of the disclosure are intended only to describe specific embodiments rather than limit the disclosure. In addition, certain terms used throughout the specification and appended claims refer to specific components. It may be understood by persons of ordinary skill in the art that the manufacturer may use different names to represent a component. Herein, it is not intended to distinct components with different names but a same function. In the following description and embodiments, the terms "include" and "comprise" are used in an open style, and therefore, should be understood as "include, but is not limited to . . . ". Similarly, the term "be connected to" is intended to express indirect or direct electrical connection. Correspondingly, if a device is connected to another device, the connection may be a direct electrical connection or an indirect electrical connection by using other devices and connection components.

It is to be understood that, although the terms "first", "second", and the like may be used to describe components herein, these components are not to be limited by the terms. These terms are only used to distinguish one component from another component. For example, without departing from the scope of the disclosure, a first component may be referred to as a second component, and similarly, a second component may be referred to as a first component.

In order to improve the product yield and reliability of semiconductor storage devices, internal testing of semiconductor storage products before they leave the factory ensures that all storage unit defects have been repaired by redundant units. However, in different application scenarios of semiconductor storage devices, there is a high probability of the presence of the failure defect of a single storage unit and the failure defect between adjacent storage units.

In semiconductor storage devices, parity check is generally used to detect and correct the failure defect of a single storage unit. However, the parity check method cannot detect the failure defect between adjacent storage units, and cannot find and repair the failure defect between adjacent storage units in semiconductor storage devices in time. It tends to cause more failure defects between adjacent storage units in semiconductor storage devices, which affects the accuracy and service life of storage data in the semiconductor storage products.

For a semiconductor storage device, storage capacity and the accuracy of storage data are one of its important performance parameters. However, with the increase of the storage capacity of semiconductor storage devices, the quantity of storage units distributed in the unit area chip continues to increase, the density of storage units in the storage chip continues to increase, and a spacing distance between adjacent storage units continues to decrease. As a result, a failure defect of a single storage unit 101 and a failure defect between adjacent storage units 102 are easy to occur during using of the semiconductor storage device in different applications, as shown in FIG. 1. However, check methods for checking the read data of the semiconductor chip storage unit cannot detect the failure defect between adjacent storage units 102, and a 2-bit data error caused by the failure defect between adjacent storage units 102 in semiconductor storage devices cannot be found and repaired in time, thereby affecting the accuracy of storage data in the semiconductor storage products. To find and repair the 2-bit data error caused by the failure defect between adjacent storage units 102 in semiconductor storage devices in time and improve the accuracy and service life of storage data in the semiconductor storage products, the disclosure provides a storage device.

Figure 2A:
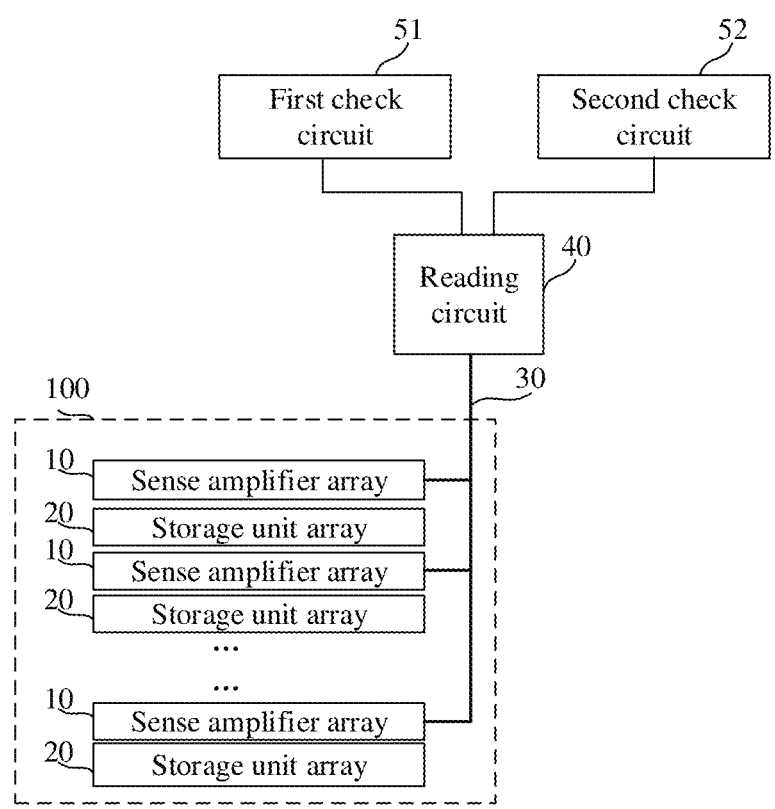
FIG. 2A is a schematic diagram of a circuit principle of a storage device according to a first embodiment of the disclosure.

For example, referring to FIG. 2A, in an embodiment of the disclosure, the storage device includes a storage circuit 100, a reading circuit 40, a first check circuit 51, and a second check circuit 52. The storage circuit 100 includes a plurality of sense amplifier arrays 10 and a plurality of storage unit arrays 20. The sense amplifier arrays 10 and the storage unit arrays 20 are arranged alternately. The sense amplifier arrays 10 are configured to read and write data to the storage unit arrays 20. A first data wire 30 is electrically connected to each of the sense amplifier arrays 10. The reading circuit 40 is electrically connected to the first data wire 30 and configured to read data on the first data wire 30. The first check circuit 51 is electrically connected to the reading circuit 40. The second check circuit 52 is electrically connected to the reading circuit 40. The reading circuit 40 is configured to: transmit a part of read data to the first check circuit 51 for error checking and/or correcting, and transmit the other part of the read data to the second check circuit 52 for error checking and/or correcting, where the data transmitted to the first check circuit 51 and the data transmitted to the second check circuit 52 are respectively from adjacent sense amplifier arrays 10.

For example, still referring to FIG. 2A, by providing the storage unit arrays 20 and the sense amplifier arrays 10 configured to read and write data to the storage unit arrays 20 in the storage circuit 100 alternately, each of the sense amplifier arrays 10 is electrically connected to the first data wire 30, for example, a global data wire YIO, to receive data on the first data wire 30. The data on the first data wire 30 includes to-be-written data and check code data. As such, the reading circuit 40 transmits a part of the read data to the first check circuit 51 for error checking and/or correcting, and transmits the other part of the read data to the second check circuit 52 for error checking and/or correcting. The data transmitted to the first check circuit 51 and the data transmitted to the second check circuit 52 are respectively from adjacent sense amplifier arrays 10, to avoid a situation that the failure defect between adjacent storage units cannot be identified. In this way, a 2-bit error caused by the adjacent storage units failure in semiconductor storage devices can be found and repaired in time and the accuracy and service life of storage data in the semiconductor storage products can be improved.

Figure 2B:
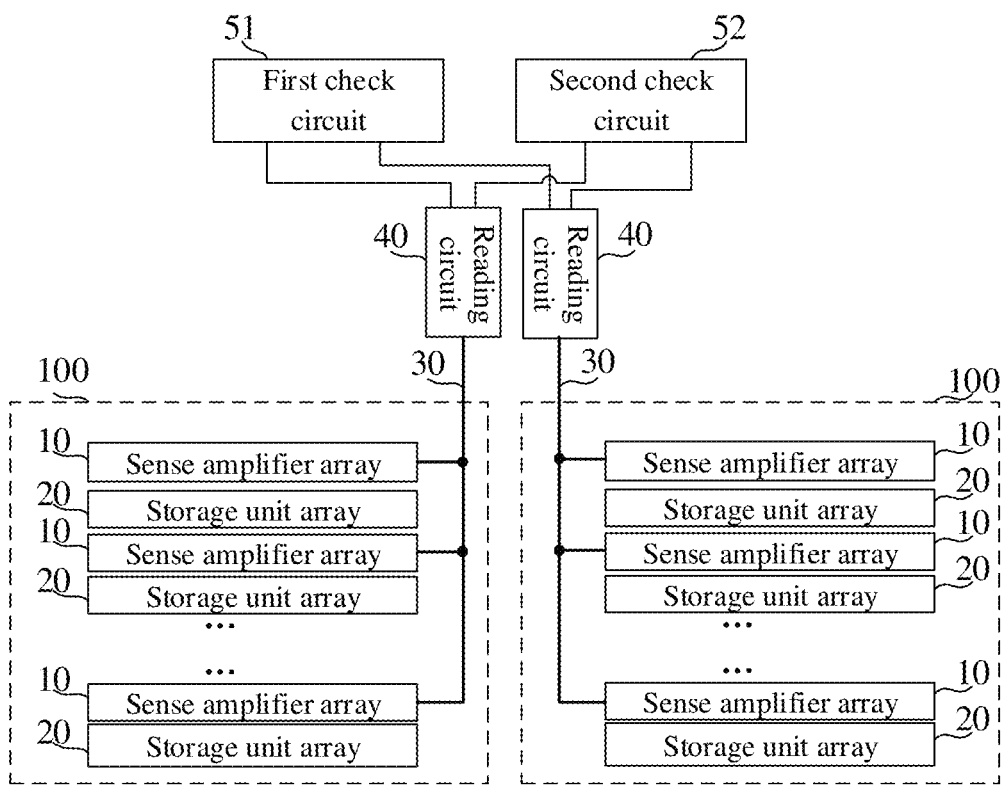
FIG. 2B is a schematic diagram of a circuit principle of a storage device according to a second embodiment of the disclosure.

For example, referring to FIG. 2B, in an embodiment of the disclosure, the storage circuit 100 and the reading circuit 40 may be disposed correspondingly. Each of the storage circuit 100 includes a plurality of sense amplifier arrays 10 and a plurality of storage unit arrays 20. The sense amplifier arrays 10 and the storage unit arrays 20 are arranged alternately, and the sense amplifier arrays 10 are configured to read and write data to the storage unit arrays 20. Each of the sense amplifier arrays 10 in each of the storage circuits 100 is electrically connected to the corresponding reading circuit 40 by using the first data wire 30. The reading circuit 40 is configured to read data on the first data wire 30 to which the reading circuit is electrically connected, transmit a part of read data to the first check circuit 51 for error checking and/or correcting, and transmit the other part of the read data to the second check circuit 52 for error checking and/or correcting. The data transmitted to the first check circuit 51 and the data transmitted to the second check circuit 52 are respectively from adjacent sense amplifier arrays 10. For example, for each of storage circuits 100, a corresponding reading circuit 40 may be configured to transmit read data of a sense amplifier array 10 with codes of even numbers to the first check circuit 51, and transmit read data of a sense amplifier array 10 with codes of odd numbers to the second check circuit 52. Similarly, in an embodiment of the disclosure, for each of storage circuits 100, a corresponding reading circuit 40 may be configured to transmit read data of a sense amplifier array 10 with codes of odd numbers to the first check circuit 51, and transmit read data of a sense amplifier array 10 with codes of even numbers to the second check circuit 52. According to this embodiment, a situation that the failure defect between adjacent storage units cannot be identified can be avoided, such that a 2-bit data error caused by the adjacent storage units failure in semiconductor storage devices can be found and repaired in time and the accuracy and service life of storage data in the semiconductor storage products can be improved.

Figure 2C:
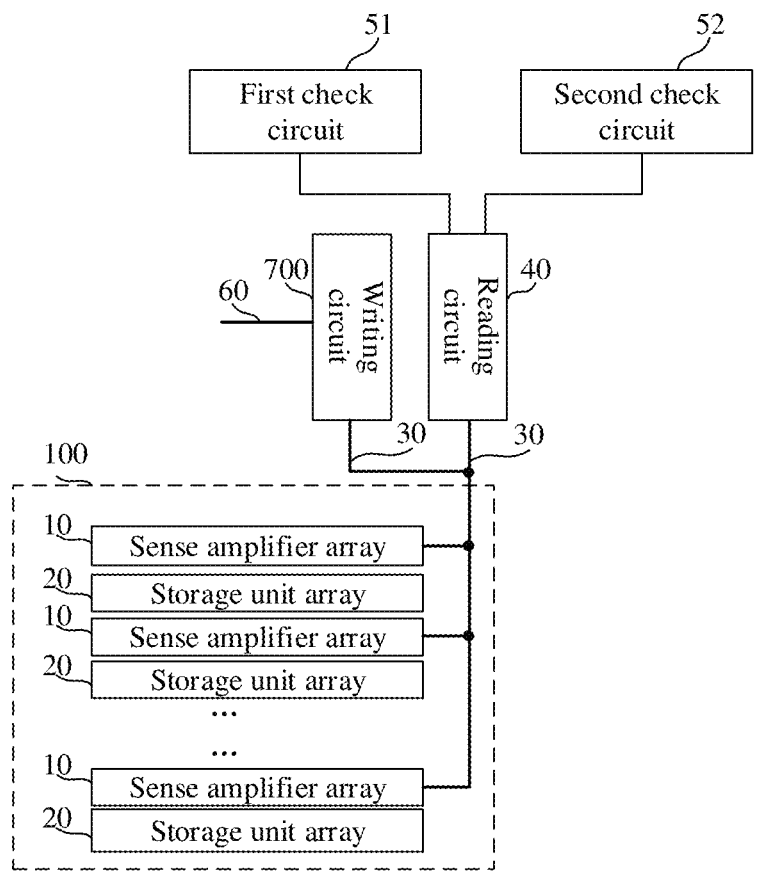
FIG. 2C is a schematic diagram of a circuit principle of a storage device according to a third embodiment of the disclosure.

For example, referring to FIG. 2C, in an embodiment of the disclosure, the storage device further includes a writing circuit 700. The writing circuit 700 is electrically connected to both the first data wire 30 and the second data wire 60. The writing circuit 700 is configured to write data into the first data wire 30 according to data in the second data wire 60. For example, referring to FIG. 3, in an embodiment of the disclosure, the first data wire 30 includes a plurality of groups of first positive data wires 31 and first negative data wires 32. The first positive data wire 31 and the first negative data wire 32 transmit data inverse to each other. In this way, the data transmitted by the first positive data wire 31 and the first negative data wire 32 can be referenced or compared with each other to improve the accuracy of data transmission. In this embodiment, the first positive data wire 31 may be a global data wire YIO, and the first negative data wire 32 may be a complementary global data wire YIO_. The global data wire YIO and the complementary global data wire YIO_ transmit data inverse to each other.

Figure 3:
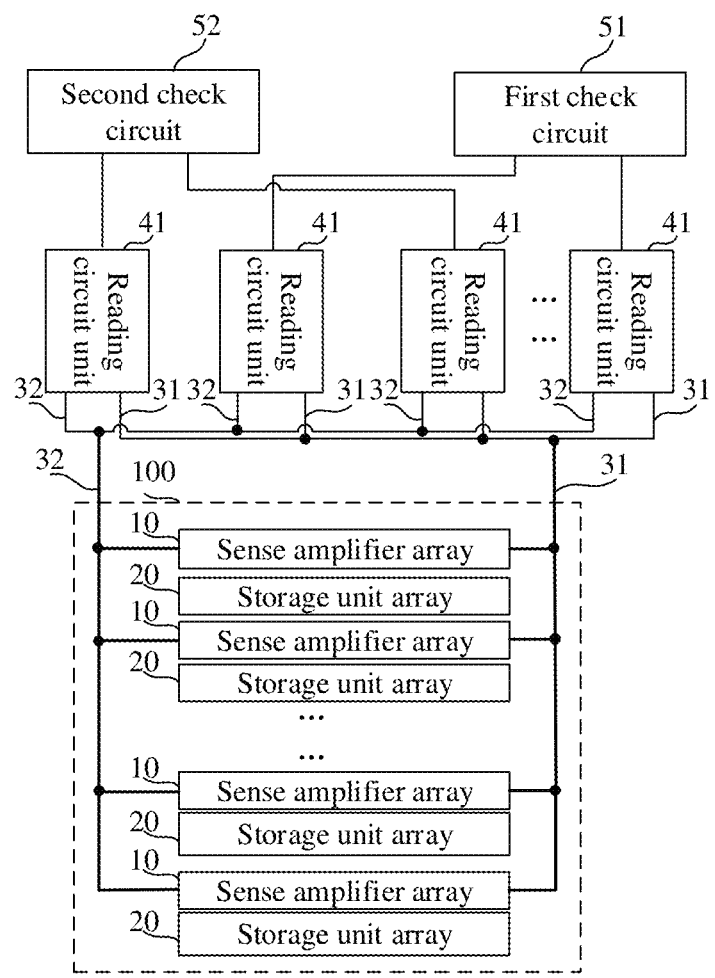
FIG. 3 is a schematic diagram of a circuit principle of a storage device according to a fourth embodiment of the disclosure.

For example, still referring to FIG. 3, in an embodiment of the disclosure, the reading circuit 40 includes a plurality of reading circuit units 41, and each of the reading circuit units 41 is electrically connected to one group of the first positive data wire 31 and the first negative data wire 32. In this way, a corresponding reading circuit unit 41 is provided for each of the storage units, such that data read from the corresponding storage unit can be amplified by the reading circuit unit 41 to improve the anti-noise capability of data transmission, and the data on the first positive data wire 31 and the first negative data wire 32 can be referenced or compared with each other to improve the accuracy of data transmission.

Figure 4:
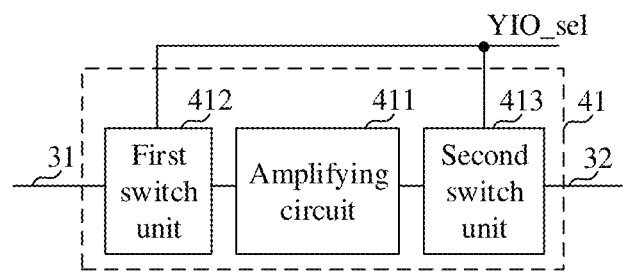
FIG. 4 is a schematic diagram of a circuit principle of a reading circuit unit according to an embodiment of the disclosure.

For example, referring to FIG. 4, in an embodiment of the disclosure, the reading circuit unit 41 includes an amplifying circuit 411. The first positive data wire 31 is electrically connected to a first input end of the amplifying circuit 411 by using a first switch unit 412. The first negative data wire 32 is electrically connected to a second input end of the amplifying circuit 411 by using a second switch unit 413. The amplifying circuit 411 is configured to amplify signals from the first input end and the second input end.

For example, still referring to FIG. 4, in an embodiment of the disclosure, both a control end of the first switch unit 412 and a control end of the second switch unit 413 receive a read enable signal YIO_sel, and are configured to transmit signals from the first positive data wire 31 and the first negative data wire 32 to the first input end of the amplifying circuit 411 and the second input end of the amplifying circuit 411 respectively responsive to the read enable signal YIO-_sel in an active state.

Figure 5:
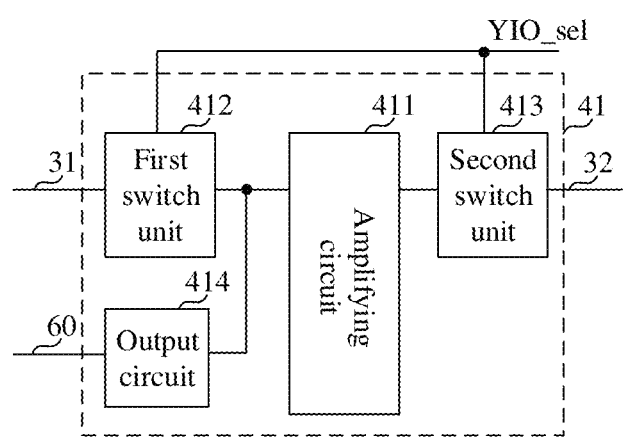
FIG. 5 is a schematic diagram of a circuit principle of a reading circuit unit according to a fifth embodiment of the disclosure.

For example, referring to FIG. 5, in an embodiment of the disclosure, the reading circuit unit 41 further includes an output circuit 414. An input end of the output circuit 414 is electrically connected to the first input end of the amplifying circuit 411. The output circuit is configured to transmit the signal from the first input end of the amplifying circuit 411 to the second data wire 60. In this embodiment, the second data wire 60 may be a local data wire LIO. In other embodiments of the disclosure, the second data wire 60 may include a local data wire LIO and a complementary local data wire LIO. The local data wire LIO and the complementary local data wire LIO transmit data inverse to each other.

Figure 6:
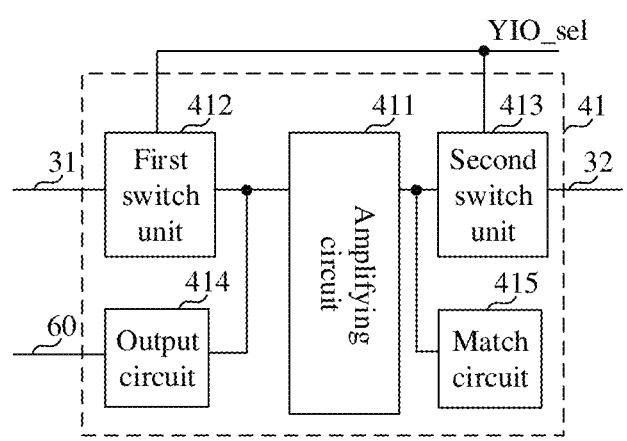
FIG. 6 is a schematic diagram of a circuit principle of a reading circuit unit according to a sixth embodiment of the disclosure.

For example, referring to FIG. 6, in an embodiment of the disclosure, the reading circuit unit 41 further includes a match circuit 415. The match circuit 415 is electrically connected to the second input end of the amplifying circuit 411 and is configured to match loads of the first input end of the amplifying circuit 411 and of the second input end of the amplifying circuit 411.

Figure 7:
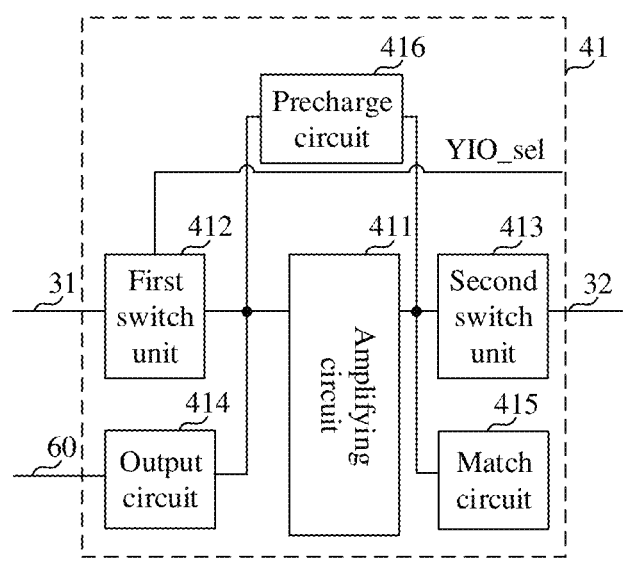
FIG. 7 is a schematic diagram of a circuit principle of a reading circuit unit according to a seventh embodiment of the disclosure.

For example, referring to FIG. 7, in an embodiment of the disclosure, the reading circuit unit 41 further includes a precharge circuit 416. The precharge circuit 416 is electrically connected to both the first input end of the amplifying circuit 411 and the second input end of the amplifying circuit 411 and is configured to precharge.

Figure 8:
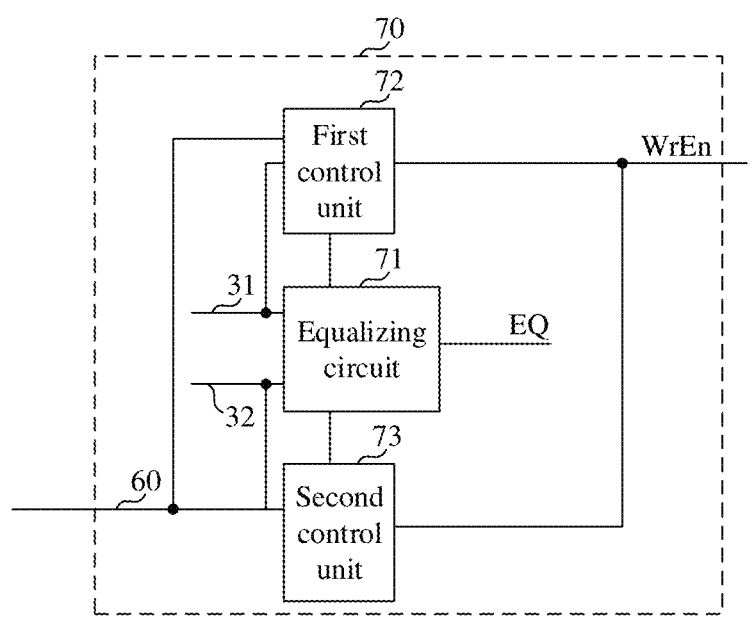
FIG. 8 is a schematic diagram of a circuit principle of a writing circuit unit according to an embodiment of the disclosure.

For example, referring to FIG. 8, in an embodiment of the disclosure, the storage device further includes a writing circuit (not shown in FIG. 8). The writing circuit includes a plurality of writing circuit units 70. Each of the writing circuit units 70 is electrically connected to the second data wire 60, a writing enable signal WrEn, an equalizing signal EQ, and a group of the first positive data wire 31 and the first negative data wire 32. The writing circuit is configured to write data into the first positive data wire 31 or the first negative data wire 32 according to the writing enable signal and the equalizing signal.

For example, still referring to FIG. 8, in an embodiment of the disclosure, the writing circuit unit 70 includes an equalizing circuit 71, a first control unit 72, and a second control unit 73. The equalizing circuit 71 is electrically connected to each of the first positive data wire 31, the first negative data wire 32, and the equalizing signal EQ. The first control unit 72 is electrically connected to each of the first positive data wire 31, the equalizing circuit 71, the writing enable signal WrEn, and the second data wire 60, and configured to control the first positive data wire 31 to be connected to a high level or a low level according to the writing enable signal WrEn. The second control unit 73 is electrically connected to each of the first negative data wire 32, the equalizing circuit 71, the writing enable signal WrEn, and the second data wire 60, and configured to control the first negative data wire 32 to be connected to a high level or a low level according to the writing enable signal WrEn. In this embodiment, the first positive data wire 31 may be a global data wire YIO, and the first negative data wire 32 may be a complementary global data wire YIO_. The global data wire YIO and the complementary global data wire YIO_ transmit data inverse to each other.

Figure 9:
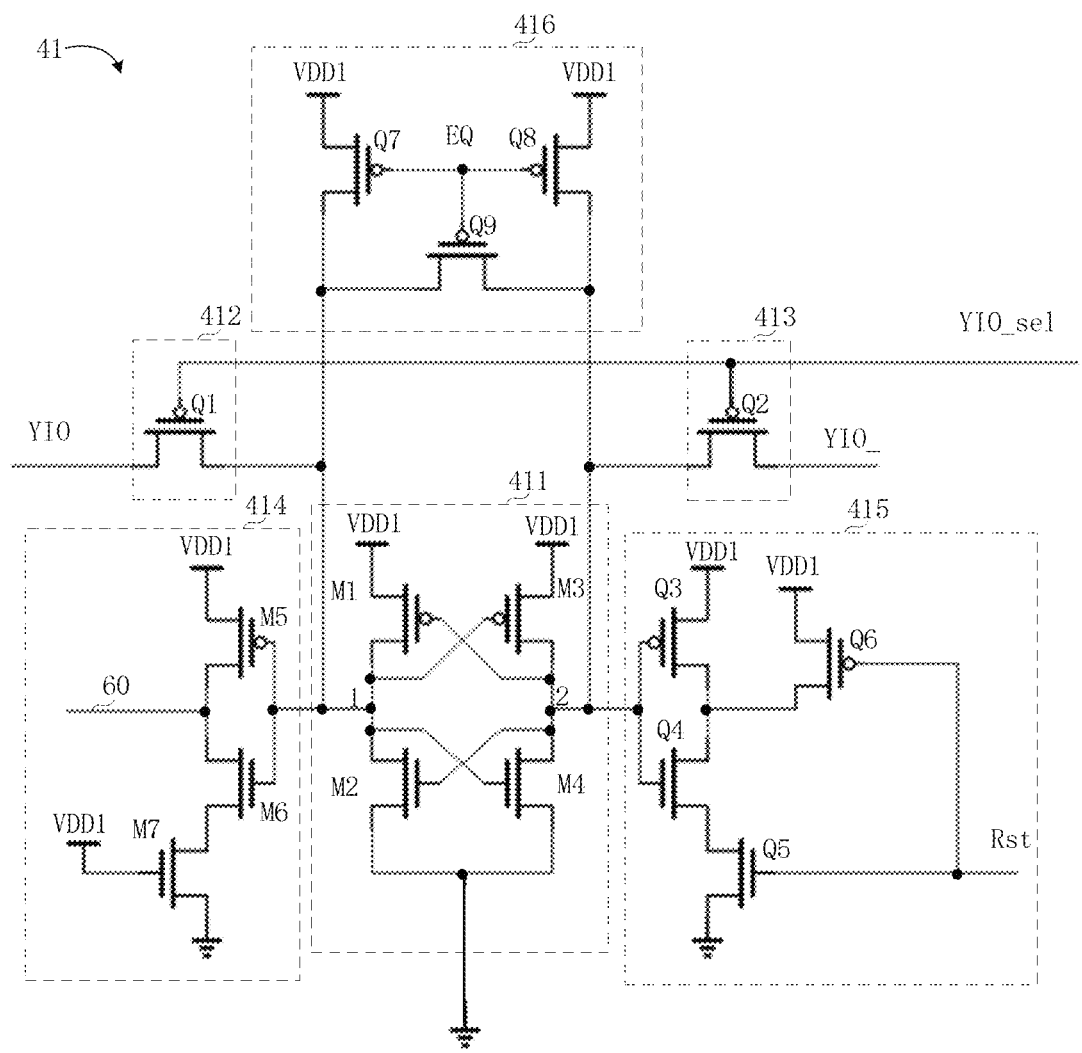
FIG. 9 is a schematic circuit diagram of a reading circuit unit according to an embodiment of the disclosure.

For example, referring to FIG. 9, in an embodiment of the disclosure, the amplifying circuit 411 includes a first transistor M1, a second transistor M2, a third transistor M3, and a fourth transistor M4. The first transistor M1 is configured with a source to be electrically connected to a first voltage VDD1, and a gate to be electrically connected to the second input end 2 of the amplifying circuit 411. The second transistor M2 is configured with a source to be grounded, and a drain to be electrically connected to both a drain of the first transistor M1 and the first input end 1 of the amplifying circuit 411. The third transistor M3 is configured with a source to be electrically connected to the first voltage VDD1, a drain to be electrically connected to both the gate of the first transistor M1 and the second input end 2 of the amplifying circuit 411, and a gate to be electrically connected to the first input end 1 of the amplifying circuit 411. The fourth transistor M4 is configured with a source to be grounded, a drain to be electrically connected to both the drain of the third transistor M3 and the gate of the second transistor M2, and a gate to be electrically connected to the first input end 1 of the amplifying circuit 411. In other embodiments of the disclosure, both the source of the second transistor M2 and the source of the fourth transistor M4 may be electrically connected to a second voltage whose amplitude is lower than that of the first voltage VDD1. In this embodiment, both the source of the second transistor M2 and the source of the fourth transistor M4 are grounded, which is intended to describe an implementation principle of this embodiment.

For example, still referring to FIG. 9, by providing the first transistor M1 and the second transistor M2 in series to form the first inverter and providing the third transistor M3 and the fourth transistor M4 in series to form the second inverter, the first inverter and the second inverter are jointly functioned as a latch. The latch may output data read through the global data wire YIO and complementary global data wire YIO_ after amplifying and latching to improve the anti-noise ability of the outputted data.

For example, still referring to FIG. 9, the output circuit 414 includes a fifth transistor M5 and a sixth transistor M6. The fifth transistor M5 is configured with a source to be electrically connected to the first voltage VDD1, a gate to be electrically connected to the first input end 1 of the amplifying circuit 411, and a drain to be electrically connected to the second data wire 60. The sixth transistor M6 is configured with a drain to be electrically connected to both the drain of the fifth transistor M5 and the second data wire 60, and a gate to be electrically connected to both the gate of the fifth transistor M5 and the first input end 1 of the amplifying circuit 411.

For example, still referring to FIG. 9, by controlling the action of the fifth transistor M5 and the sixth transistor M6 to control the power supply of the amplifying circuit 411, and by collaborating with the action of the first transistor M1, the second transistor M2, the third transistor M3, and the fourth transistor M4 in combination with the electric energy demand of the amplifying circuit 411 in the precharging stage, charge sharing stage, amplification stage, and write back stage, the amplifying circuit 411 may amplify and latch the data read through the global data wire YIO and the complementary global data wire YIO_ and may output the amplified and latched data through the output circuit 414 to write them into the storage unit.

For example, still referring to FIG. 9, the output circuit 414 further includes a seventh transistor M7. A source of the sixth transistor M6 is grounded by using the seventh transistor M7. In other embodiments of the disclosure, the source of the sixth transistor M6 may be configured to be electrically connected to a second voltage whose amplitude is lower than that of the first voltage VDD1 by using the seventh transistor M7.

For example, still referring to FIG. 9, in an embodiment of the disclosure, the first switch unit 412 may be configured to include a transistor Q1, and the second switch unit 413 may be configured to include a transistor Q2. The transistor Q1 is configured with a source to be electrically connected to the global data wire YIO, a drain to be electrically connected to the first input end 1 of the amplifying circuit 411, and a gate to be electrically connected to a read enable signal YIO_sel. The transistor Q2 is configured with a source to be electrically connected to the complementary global data wire YIO_, a drain to be electrically connected to the second input end 2 of the amplifying circuit 411, and a gate to be electrically connected to a read enable signal YIO_sel. The transistor Q1 and the transistor Q2 are configured to transmit signals of the global data wire YIO and the complementary global data wire YIO to the first input end 1 of the amplifying circuit 411 or the second input end 2 of the amplifying circuit 411 responsive to the read enable signal YIO_sel in an active state.

For example, still referring to FIG. 9, in an embodiment of the disclosure, the match circuit 415 includes a transistor Q3, a transistor Q4, a transistor Q5, and a transistor Q6. The transistor Q3 is configured with a source to be electrically connected to a first voltage VDD1, and a gate to be electrically connected to the second input end 2 of the amplifying circuit 411. The transistor Q4 is configured with a drain to be electrically connected to the drain of the transistor Q3, and a gate to be electrically connected to the second input end 2 of the amplifying circuit 411. The transistor Q5 is configured with a drain to be electrically connected to a source of the transistor Q4, a source to be grounded, and a gate to be electrically connected to a reset control signal Rst. The transistor Q6 is configured with a source to be electrically connected to the first voltage VDD1, a drain to be electrically connected to both the drain of the transistor Q3 and the drain of the transistor Q4, and a gate to be electrically connected to the reset control signal Rst.

For example, still referring to FIG. 9, in an embodiment of the disclosure, a precharge circuit 416 includes a transistor Q7, a transistor Q8, and a transistor Q9. The transistor Q7 is configured with a source to be electrically connected to the first voltage VDD1, a drain to be electrically connected to the first input end 1 of the amplifying circuit 411, and a gate to be electrically connected to the equalizing signal EQ. The transistor Q8 is configured with a source to be electrically connected to the first voltage VDD1, a drain to be electrically connected to the second input end 2 of the amplifying circuit 411, and a gate to be electrically connected to the equalizing signal EQ. The transistor Q9 is configured with a source to be electrically connected to both the first input end 1 of the amplifying circuit 411 and the drain of the transistor Q7, a drain to be electrically connected to both the second input end 2 of the amplifying circuit 411 and the drain of the transistor Q8, and a gate to be electrically connected to the equalizing signal EQ.

Figure 10:
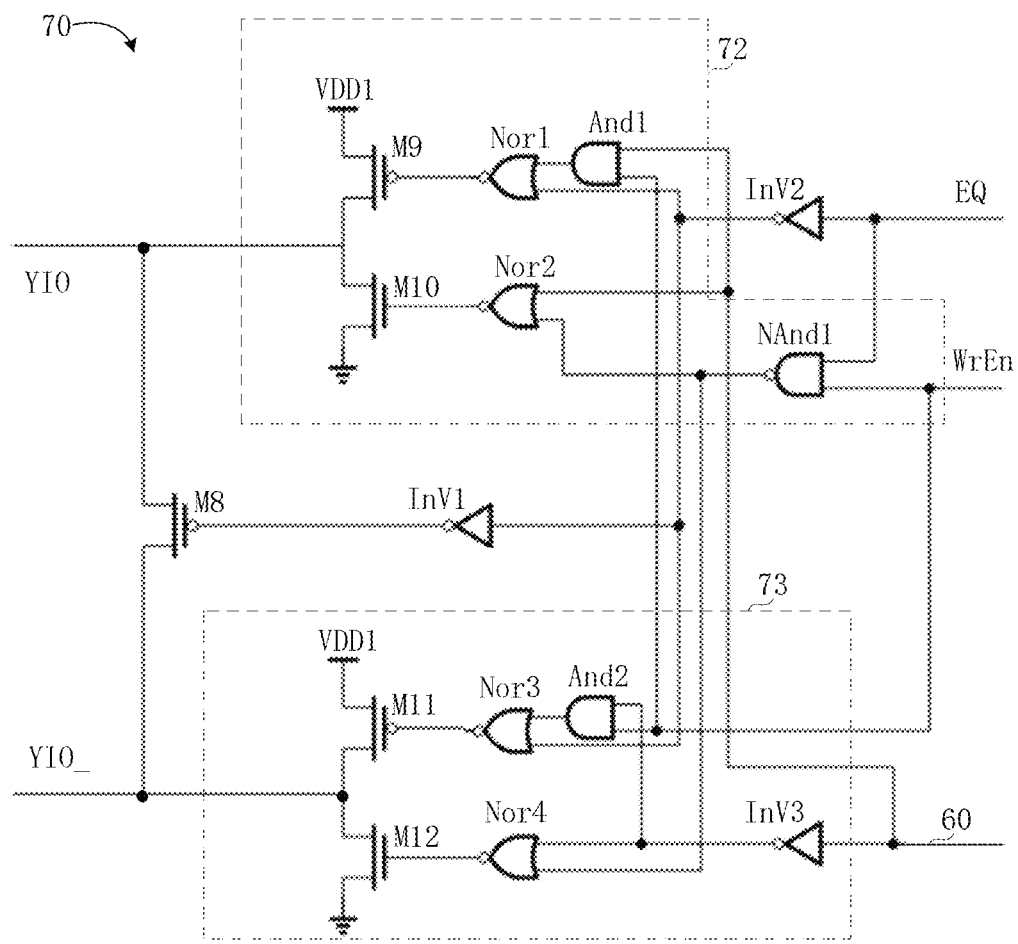
FIG. 10 is a schematic circuit diagram of a writing circuit unit according to an embodiment of the disclosure.

For example, referring to FIG. 10, in an embodiment of the disclosure, an equalizing circuit (not shown in FIG. 10) includes an eighth transistor M8, a first inverter InV1 and a second inverter InV2. The eighth transistor M8 is configured with a source to be electrically connected to the global data wire YIO, and a drain to be electrically connected to the complementary global data wire YIO_. The first inverter InV1 is configured with an output end to be electrically connected to a gate of the eighth transistor M8, and an input end to be electrically connected to both the first control unit 72 and the second control unit 73. The second inverter InV2 is configured with an output end to be electrically connected to each of the input end of the first inverter InV1, the first control unit 72, and the second control unit 73, and an input end to be electrically connected to the equalizing signal EQ.

For example, still referring to FIG. 10, the first control unit 72 includes a ninth transistor M9, a tenth transistor M10, a first NOR gate Nor1, a second NOR gate Nor2, a first NAND gate NAnd1, and a first AND gate And1. The ninth transistor M9 is configured with a source to be electrically connected to the first voltage VDD1, and a drain to be electrically connected to the global data wire YIO. The tenth transistor is configured with a drain to be electrically connected to both the drain of the ninth transistor and the global data wire YIO, and a source to be grounded. The first NOR gate Nor1 is configured with an output end to be electrically connected to a gate of the ninth transistor M9, and a first input end to be electrically connected to the output end of the second inverter InV2. The second NOR gate Nor2 is configured with an output end to be electrically connected to a gate of the tenth transistor M10, a first input end to be electrically connected to the second control unit 73, and a second input end to be electrically connected to the second data wire 60. The first NAND gate NAnd1 is configured with an output end to be electrically connected to a first input end of the second NOR gate Nor2, a first input end to be electrically connected to the writing enable signal WrEn, and a second input end to be electrically connected to the equalizing signal EQ. The first AND gate And1 is configured with an output end to be electrically connected to a second input end of the first NOR gate Nor1, a first input end to be electrically connected to the writing enable signal WrEn, and a second input end to be electrically connected to the second data wire 60. In this embodiment, the second data wire 60 may be a local data wire LIO. In other embodiments of the disclosure, the second data wire 60 may include a local data wire LIO and a complementary local data wire LIO. The local data wire LIO and the complementary local data wire LIO transmit data inverse to each other.

For example, still referring to FIG. 10, in an embodiment of the disclosure, the second control unit 73 includes an eleventh transistor M11, a twelfth transistor M12, a third NOR gate Nor3, a fourth NOR gate Nor4, a second AND gate And2, and a third inverter InV3. The eleventh transistor M11 is configured with a source to be electrically connected to the first voltage VDD1, and a drain to be electrically connected to the complementary global data wire YIO_. The twelfth transistor M12 is configured with a drain to be electrically connected to both the drain of the eleventh transistor M11 and the complementary global data wire YIO_, and a source to be grounded. The third NOR gate Nor3 is configured with an output end to be electrically connected to a gate of the eleventh transistor M11, and a first input end to be electrically connected to the output end of the second inverter InV2. The fourth NOR gate Nor4 is configured with an output end to be electrically connected to a gate of the twelfth transistor M12, and a first input end to be electrically connected to the output end of the first NAND gate NAnd1. The second AND gate And2 is configured with an output end to be electrically connected to a second input end of the third NOR gate Nor3, and a first input end to be electrically connected to the writing enable signal WrEn. The third inverter InV3 is configured with an output end to be electrically connected to a second input end of the fourth NOR gate Nor4 and the second input end of the second AND gate And2, and an input end to be electrically connected to the second data wire 60. In this embodiment, the second data wire 60 may be a local data wire LIO. In other embodiments of the disclosure, the second data wire 60 may include a local data wire LIO and a complementary local data wire LIO. The local data wire LIO and the complementary local data wire LIO transmit data inverse to each other.

The foregoing embodiments are only for illustration rather than limitation to the disclosure.

All embodiments in this specification are described in a progressive manner. Each embodiment focuses on the differences from other embodiments, and the same and similar parts among all embodiments can be referred to each other.

The technical features of the foregoing embodiments can be combined arbitrarily. In order to make the description concise, not all possible combinations of the technical features of the foregoing embodiments are described. However, as long as the combination of these technical features does not contradict each other, they shall be considered to be within the scope of this specification.

The foregoing embodiments only illustrate several implementations of the disclosure, and their description is more specific and detailed, but it cannot be understood as the limitation to the invention patent scope. It is to be noted that, for a person of ordinary skill in the art, many variants and improvements may also be made without departure from the scope of the disclosure, and these are all in the protection scope of the disclosure. Therefore, the protection scope of the disclosure shall be construed by the appended claims.

What is claimed is:

1. A storage device, comprising:
a storage circuit, comprising a plurality of sense amplifier arrays and a plurality of storage unit arrays, the sense amplifier arrays and the storage unit arrays being arranged alternately, and the sense amplifier arrays being configured to read and write data to the storage unit arrays;
a first data wire, electrically connected to each of the sense amplifier arrays;
a reading circuit, electrically connected to the first data wire and configured to read data on the first data wire;
a first check circuit, electrically connected to the reading circuit; and
a second check circuit, electrically connected to the reading circuit; the reading circuit being configured to transmit a part of read data to the first check circuit for error checking and/or correcting, and transmit another part of read data to the second check circuit for error checking and/or correcting,
wherein the data transmitted to the first check circuit and the data transmitted to the second check circuit are respectively from adjacent sense amplifier arrays.

2. The storage device according to claim 1, wherein the first data wire comprises a plurality of groups of first positive data wires and first negative data wires, and the first positive data wires and the first negative data wires transmit data inverse to each other.

3. The storage device according to claim 2, wherein the reading circuit comprises a plurality of reading circuit units, and each of the reading circuit units is electrically connected to one group of the first positive data wire and the first negative data wire.

4. The storage device according to claim 3, wherein the reading circuit unit comprises an amplifying circuit, the first positive data wire is electrically connected to a first input end of the amplifying circuit by using a first switch unit, the first negative data wire is electrically connected to a second input end of the amplifying circuit by using a second switch unit, and wherein the amplifying circuit is configured to amplify signals from the first input end and the second input end.

5. The storage device according to claim 4, wherein both a control end of the first switch unit and a control end of the second switch unit receive a read enable signal, and are configured to transmit signals of the first positive data wire and of the first negative data wire to the first input end of the amplifying circuit and the second input end of the amplifying circuit respectively responsive to the read enable signal in an active state.

6. The storage device according to claim 5, wherein the reading circuit unit further comprises an output circuit, an input end of the output circuit is electrically connected to the first input end of the amplifying circuit, and wherein the output circuit is configured to transmit the signal from the first input end of the amplifying circuit to the second data wire.

7. The storage device according to claim 5, wherein the reading circuit unit further comprises a match circuit, and the match circuit is electrically connected to the second input end of the amplifying circuit and is configured to match loads of the first input end of the amplifying circuit and of the second input end of the amplifying circuit.

8. The storage device according to claim 7, wherein the reading circuit unit further comprises a precharge circuit, and the precharge circuit is electrically connected to both the first input end of the amplifying circuit and the second input end of the amplifying circuit and is configured to precharge.

9. The storage device according to claim 4, wherein the amplifying circuit comprises:
a first transistor, configured with a source to be electrically connected to a first voltage, and a gate to be electrically connected to the second input end of the amplifying circuit;

a second transistor, configured with a source to be electrically connected to a second voltage, and a drain to be electrically connected to both a drain of the first transistor and the first input end of the amplifying circuit;

a third transistor, configured with a source to be electrically connected to the first voltage, a drain to be electrically connected to both the gate of the first transistor and the second input end of the amplifying circuit, and a gate to be electrically connected to the first input end of the amplifying circuit; and a fourth transistor, configured with a source to be electrically connected to the second voltage, a drain to be electrically connected to both the drain of the third transistor and the gate of the second transistor, and a gate to be electrically connected to the first input end of the amplifying circuit.

10. The storage device according to claim 6, wherein the output circuit comprises:

a fifth transistor, configured with a source to be electrically connected to a first voltage, a gate to be electrically connected to the first input end of the amplifying circuit, and a drain to be electrically connected to the second data wire; and a sixth transistor, configured with a drain to be electrically connected to both the drain of the fifth transistor and the second data wire, and a gate to be electrically connected to both the gate of the fifth transistor and the first input end of the amplifying circuit.

11. The storage device according to claim 10, wherein the output circuit further comprises:

a seventh transistor, wherein the source of the sixth transistor is electrically connected to a second voltage by using the seventh transistor.

12. The storage device according to claim 10, further comprising a writing circuit, wherein the writing circuit comprises a plurality of writing circuit units, and each of the writing circuit units is electrically connected to the second data wire, a writing enable signal, an equalizing signal, and a group of the first positive data wire and the first negative data wire, and the writing circuit is configured to write data into the first positive data wire or the first negative data wire according to the writing enable signal and the equalizing signal.

13. The storage device according to claim 12, wherein the writing circuit unit comprises:

an equalizing circuit, electrically connected to each of the first positive data wire, the first negative data wire, and the equalizing signal;

a first control unit, electrically connected to each of the first positive data wire, the equalizing circuit, the writing enable signal, and the second data wire, and configured to control the first positive data wire to be connected to a high level or a low level according to the writing enable signal; and a second control unit, electrically connected to each of the first negative data wire, the equalizing circuit, the writing enable signal, and the second data wire, and configured to control the first negative data wire to be connected to a high level or a low level according to the writing enable signal.

14. The storage device according to claim 13, wherein the equalizing circuit comprises:

an eighth transistor, configured with a source to be electrically connected to the first positive data wire, and a drain to be electrically connected to the first negative data wire;

a first inverter, configured with an output end to be electrically connected to a gate of the eighth transistor, and an input end to be electrically connected to both the first control unit and the second control unit; and a second inverter, configured with an output end to be electrically connected to each of the input end of the first inverter, the first control unit, and the second control unit, and an input end to be electrically connected to the equalizing signal.

15. The storage device according to claim 14, wherein the first control unit comprises:

a ninth transistor, configured with a source to be electrically connected to the first voltage, and a drain to be electrically connected to the first positive data wire;

a tenth transistor, configured with a drain to be electrically connected to both the drain of the ninth transistor and the first positive data wire, and a source to be electrically connected to the second voltage;

a first NOR gate, configured with an output end to be electrically connected to a gate of the ninth transistor, and a first input end to be electrically connected to the output end of the second inverter;

a second NOR gate, configured with an output end to be electrically connected to a gate of the tenth transistor, and a second input end to be electrically connected to the second data wire;

a first NAND gate, configured with an output end to be electrically connected to a first input end of the second NOR gate, a first input end to be electrically connected to the writing enable signal, and a second input end to be electrically connected to the equalizing signal; and a first AND gate, configured with an output end to be electrically connected to a second input end of the first NOR gate, a first input end to be electrically connected to the writing enable signal, and a second input end to be electrically connected to the second data wire.

16. The storage device according to claim 15, wherein the second control unit comprises:

an eleventh transistor, configured with a source to be electrically connected to the first voltage, and a drain to be electrically connected to the first negative data wire;

a twelfth transistor, configured with a drain to be electrically connected to both the drain of the eleventh transistor and the first negative data wire, and a source to be electrically connected to the second voltage;

a third NOR gate, configured with an output end to be electrically connected to a gate of the eleventh transistor, and a first input end to be electrically connected to the output end of the second inverter;

a fourth NOR gate, configured with an output end to be electrically connected to a gate of the twelfth transistor, and a first input end to be electrically connected to the output end of the first NAND gate;

a second AND gate, configured with an output end to be electrically connected to a second input end of the third NOR gate, and a first input end to be electrically connected to the writing enable signal; and a third inverter, configured with an output end to be electrically connected to both a second input end of the fourth NOR gate and the second input end of the second AND gate, and an input end to be electrically connected to the second data wire.

* * * * *